United States Patent
Marchant et al.

(10) Patent No.: US 7,382,019 B2
(45) Date of Patent: Jun. 3, 2008

(54) TRENCH GATE FETS WITH REDUCED GATE TO DRAIN CHARGE

(75) Inventors: Bruce D. Marchant, Murray, UT (US); Ashok Challa, Sandy, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 217 days.

(21) Appl. No.: 11/116,106

(22) Filed: Apr. 26, 2005

(65) Prior Publication Data

US 2006/0237781 A1    Oct. 26, 2006

(51) Int. Cl.
  H01L 29/76 (2006.01)
  H01L 29/94 (2006.01)
  H01L 31/062 (2006.01)
  H01L 31/113 (2006.01)
  H01L 31/119 (2006.01)

(52) U.S. Cl. ............ 257/330; 257/334
(58) Field of Classification Search ........ 257/60, 257/135, 136, 263–267, 302, 328–334
See application file for complete search history.

(56) References Cited

U.S. PATENT DOCUMENTS

| | | | |
|---|---|---|---|
| 5,637,898 A | 6/1997 | Baliga | |
| 6,365,462 B2 | 4/2002 | Baliga | |
| 6,437,386 B1 | 8/2002 | Hurst et al. | |
| 6,809,375 B2 * | 10/2004 | Takemori et al. | 257/330 |
| 7,091,573 B2 | 8/2006 | Hirler et al. | |
| 2005/0116267 A1 * | 6/2005 | Zundel et al. | 257/288 |

\* cited by examiner

*Primary Examiner*—Thien F Tran
(74) *Attorney, Agent, or Firm*—Townsend and Townsend and Crew LLP (57) ABSTRACT

A field effect transistor includes a trench extending into a semiconductor region. The trench has a gate dielectric lining the trench sidewalls and a gate electrode therein. A channel region in the semiconductor region extends along a sidewall of the trench. The gate dielectric has a non-uniform thickness such that a variation in thickness of the gate dielectric along at least a lower portion of the channel region is inversely dependent on a variation in doping concentration in the at least a lower portion of the channel region.

23 Claims, 5 Drawing Sheets

TRENCH GATE FETS WITH REDUCED GATE TO DRAIN CHARGE

BACKGROUND OF THE INVENTION

The invention relates to semiconductor power devices and more particularly to a structure and method for forming a trench gate field effect transistors (FETs) with reduced gate to drain charge (Qgd).

Power FETs are used in such applications as DC-DC converters. A key parameter in achieving a high efficiency DC-DC converter is the gate to drain charge (Qgd) of the FETs used in the converter. A known method for reducing Qgd is to use a thick bottom oxide (TBO) below the trench gate electrode. This is more clearly shown in FIG. 1A.

Figure 1A:
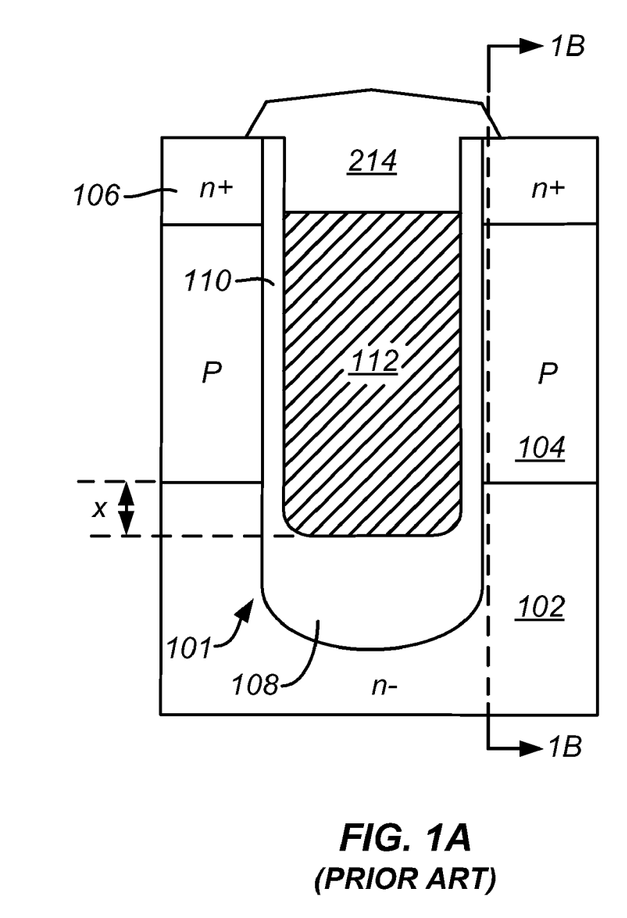
FIG. 1A is a simplified cross-section view of a conventional n-channel trench gate vertical MOSFET with thick bottom insulator.

FIG. 1A is a simplified cross-section view of a conventional n-channel trench gate vertical MOSFET. As shown, a trench 101 extends through n-type source regions 106 and p-type well region 104, and terminates within n-type drift region 102. An n-type substrate (not shown) extends below drift region 102. Typically, source regions 106 and well region 104 are formed in an n-type epitaxial layer which would also encompass drift region 102. Such epitaxial layer would normally be formed over the substrate. Trench 101 includes a thick insulator 108 along its bottom, a gate insulator 110 along its sidewalls, a recessed gate electrode 112 (typically from polysilicon), and an insulating layer 114 atop the gate electrode 112. A source metal (not shown) contacts source regions 106 and well region 104 along the top-side, and a drain metal (not shown) contacts the substrate along the bottom surface of the structure.

While the thick bottom insulator 108 helps reduce Qgd, this parameter (Qgd) still remains a significant factor in performance of such applications as DC-DC converters. Thus, techniques for further reducing Qgd are desirable.

BRIEF SUMMARY OF THE INVENTION

In accordance with an embodiment of the invention, a field effect transistor includes a trench extending into a semiconductor region. The trench has a gate dielectric lining the trench sidewalls and a gate electrode therein. A channel region in the semiconductor region extends along a sidewall of the trench. The gate dielectric has a non-uniform thickness such that a variation in thickness of the gate dielectric along at least a lower portion of the channel region is inversely dependent on variation in doping concentration in the at least a lower portion of the channel region.

In one embodiment, a lower portion of the gate dielectric has a tapered edge.

In another embodiment, the semiconductor region is of a first conductivity type, and the field effect transistor further includes a well region of a second conductivity type in the semiconductor region. A source region of the first conductivity type extends into the well region. The channel region extends in the well region and is defined by a spacing between the source region and a bottom surface of the well region.

In another embodiment, the doping concentration in at least a lower portion of the channel region decreases in the direction from the source region toward a bottom surface of the well region, and a thickness of a portion of the gate dielectric along the at least a lower portion of the channel region increases in the direction from the source region to the lower surface of the well region.

In accordance with another embodiment of the invention, a field effect transistor is formed as follows. A trench is formed in a semiconductor region of a first conductivity type. a well region of a second conductivity type is formed in the semiconductor region. A source region of the first conductivity type is formed in the well region such that a channel region defined by a spacing between the source region and a bottom surface of the well region is formed in the well region along a trench sidewall. A gate dielectric having a non-uniform thickness is formed along the trench sidewalls such that a variation in thickness of the gate dielectric along at least a lower portion of the channel region is inversely dependent on a variation in doping concentration in the lower portion of the channel region, whereby the variation in thickness of the gate dielectric does not increase a threshold voltage of the field effect transistor. A gate electrode is formed in the trench.

In one embodiment, the gate dielectric is formed as follows. A first insulating layer is formed along the trench sidewalls and bottom. The trench is then filled with a fill material having a higher etch rate than the first insulating layer. The fill material and the first insulating layer are simultaneously etched such that (i) an upper portion of the first insulating layer is completely removed from along an upper portion of the trench sidewalls and a remaining lower portion of the first insulating layer has a tapered edge, and (ii) a portion of the fill material remains at the bottom of the trench. A second insulating layer is formed at least along upper portions of the sidewalls where the first insulating layer is completely removed.

DETAILED DESCRIPTION OF THE INVENTION

In accordance with the present invention, a substantial reduction in the gate-drain charge (Qgd) of a trench gate vertical FET is obtained by using a tapered gate insulator along at least a lower portion of the channel region of the FET.

It was observed that in trench gate structures with a thick bottom insulator, the primary contributor to the device Qgd was the gate to drain charge along the trench sidewalls. In FIG. 1A, spacing X represents the distance between the bottom of well region 104 and bottom of gate electrode 112. Modeling results indicated that varying spacing X by ±0.15 µm caused Qgd to vary by a factor of 2.5. This led to investigation of techniques for reducing the Qgd along the trench sidewalls.

Figure 1B:
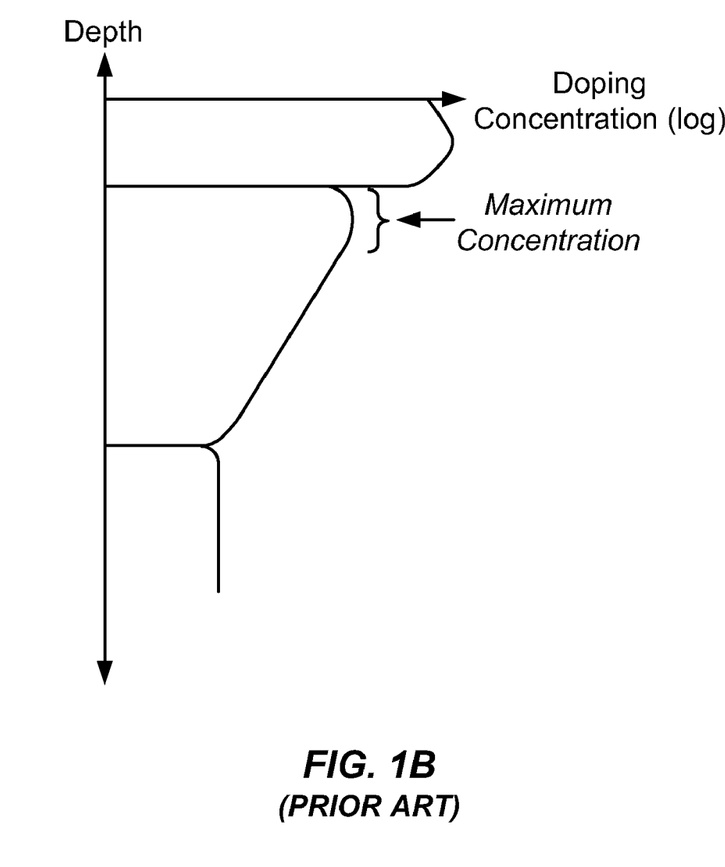
FIG. 1B shows a typical profile of the doping concentration through various silicon regions along line 1B-1B in FIG. 1A.

FIG. 1B shows a typical profile of the doping concentration through various silicon regions along line 1B-1B in FIG. 1A. As shown in FIG. 1B, due to the diffused doping through the channel region along the trench sidewall, the doping concentration near the top of the channel is at a maximum concentration and decreases significantly in the direction toward the bottom of the channel region. The threshold voltage (Vth) of the FET is in part determined by the maximum doping concentration in the channel region since that is the last point in the channel that would invert as the FET bias voltage increases toward the on state. All other locations along the channel region invert at a lower voltage.

In accordance with an embodiment of the invention, the thickness of the gate insulator along the trench sidewalls of a trench gate FET is varied inversely with the doping concentration along the channel region. That is, the gate insulator has a "normal" uniform thickness along an upper portion of the channel region where the doping concentration in the channel region is near its maximum. Along the lower portion of the channel region, the gate insulator thickness increases linearly from the "normal" thickness at a rate corresponding to the rate at which the doping concentration in the channel region drops. As an example, the gate insulator along the upper portion of the channel region where the doping concentration is near the maximum would be about 400 Å, and along the lower portion of the channel region, the gate insulator thickness increases linearly from 400 Å to about a 1000 Å near the bottom of the gate electrode.

As the thickness of the gate insulator increases along the lower portion of the channel region, the threshold voltage along the channel region (Vth(x)) increases. However, the corresponding reduction in the doping concentration along the channel region compensates for this increase in Vth(x), thus preventing the overall Vth of the FET from increasing. Therefore, by controlling the rate at which the thickness of the gate insulator changes along the lower portion of the channel region, the Vth(x) can be kept below the peak Vth in the maximum doping concentration region. This technique results in a substantial increase in the thickness of the gate insulator along the lower portion of the trench sidewalls where Qgd is highest, without adversely impacting the Vth. For example, in FIG. 1A, if the thickness of the gate insulator 110 along the spacing X is 1000 Å instead of the conventional 400 Å, then the absolute value of Qgd would be reduced by 60% (Qgd×(400/1000)). The impact of the increased gate insulator thickness on the on-resistance of the FET has been observed to be relatively small.

Figure 2:
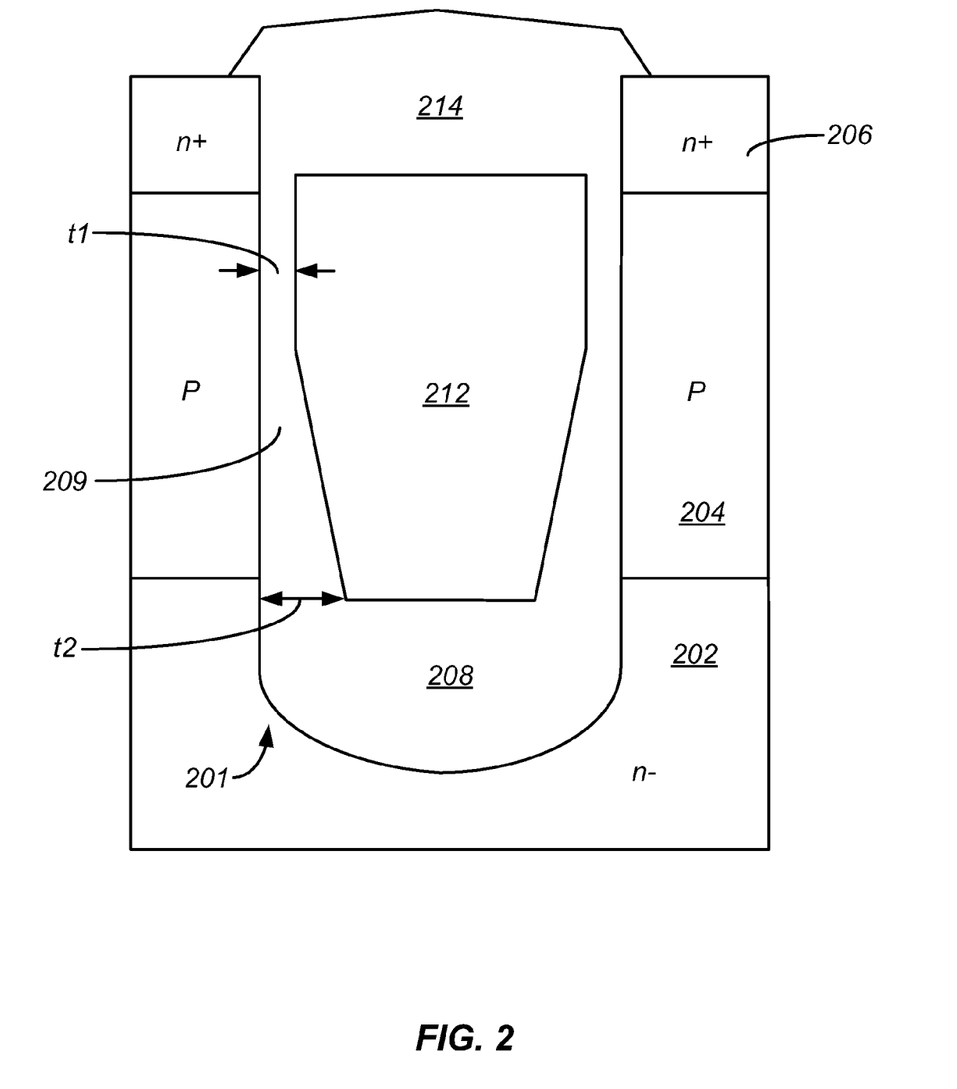
FIG. 2 shows a simplified cross section view of an n-channel trench gate vertical MOSFET in accordance with an embodiment of the invention.

FIG. 2 shows a simplified cross section view of an n-channel trench gate vertical MOSFET in accordance with an embodiment of the invention. As shown, a trench 201 extends through n-type source regions 206 and p-type well region 204, and terminates within n-type drift region 202. An n-type substrate (not shown) extends below drift region 202. In one embodiment, source regions 206 and well region 204 are formed in an n-type epitaxial layer which would also encompass drift region 202. Such epitaxial layer would be formed over the substrate. Trench 201 includes a gate insulator 209 lining the trench sidewalls. A relatively thick insulator 208 fills a bottom portion of trench 201. A recessed gate electrode 212 fills the trench over the thick bottom insulator 208. An insulating layer 214 is formed atop gate electrode 212. A source metal (not shown) contacts source regions 206 and well region 204 along the top-side, and a drain metal (not shown) contacts the substrate along the bottom surface of the structure.

As is well known in this art, when the MOSFET is biased in the on state, current flows vertically through a channel region formed along the trench sidewalls in well region 209. The channel regions thus extend along the trench sidewalls from the bottom surface of source regions 206 to the bottom surface of well region 204. As shown in FIG. 2, gate insulator 209 has a uniform thickness t1 along an upper portion of the channel region, and a non-uniform thickness along a bottom portion of the channel region.

The point at which gate insulator 209 transitions from the uniform thickness t1 to the non-uniform thickness is determined by the doping profile along the channel region. The upper portion of gate insulator 209 which has a uniform thickness t1 roughly corresponds to what is identified in FIG. 1B as the "maximum concentration" region. That is, the thickness of gate insulator 209 along the portion of the channel region where the doping concentration is near its maximum is maintained at a predetermined value t1 corresponding to a desired threshold voltage (e.g., 1.5V). The rate at which gate insulator 209 increases in thickness along the lower portion of gate insulator 209 is dependent on the rate at which the doping concentration in the corresponding portion of the channel region decreases such that the overall threshold voltage remains at the desired value (e.g., 1.5V). In this manner, the component of Qgd along the lower portions of the trench sidewalls is substantially reduced without adversely impacting the threshold voltage or other device parameters.

The table below shows process and device modeling results for three FET devices. Various parameters for a conventional FET (identified in the table as STD) and two FETs (options 1 and 2) in accordance with exemplary embodiments of the invention are tabulated. The conventional FET has a uniform gate oxide thickness of 400 Å. Option 1 corresponds to the case where the gate oxide tapers from a uniform thickness t1=400 Å along an upper portion of the channel region to a thickness t2=970 Å at the bottom of gate electrode 212 over a vertical distance of 0.19 μm. Option 2 corresponds to the case where the gate oxide tapers from a uniform thickness t1=400 Å to a thickness t2=1400 Å over a vertical distance of 0.47 μm.

|  |  | STD | Option 1 | Option 2 |
| --- | --- | --- | --- | --- |
| Taper | μm | 0 | 0.19 | 0.47 |
| Gate Oxide | Å | 400 | 970 | 1400 |
| Qgd | nC/cm² | 193 | 158 | 118 |
| Rsp (10 V) | mΩ · cm² | 0.137 | 0.141 | 0.148 |
| Rsp (4.5 V) | mΩ · cm² | 0.178 | 0.186 | 0.210 |
| Bvdss | V | 30.9 | 32.8 | 34.2 |
| Vth | V | 1.55 | 1.55 | 1.55 |

As can be seen, the FETs corresponding to options 1 and 2 respectively yield a reduction of about 20% and 40% in Qgd relative to the conventional FET, while Vth is maintained at 1.55V and the on-resistance (Rsp) is increased only slightly.

Figure 3A:
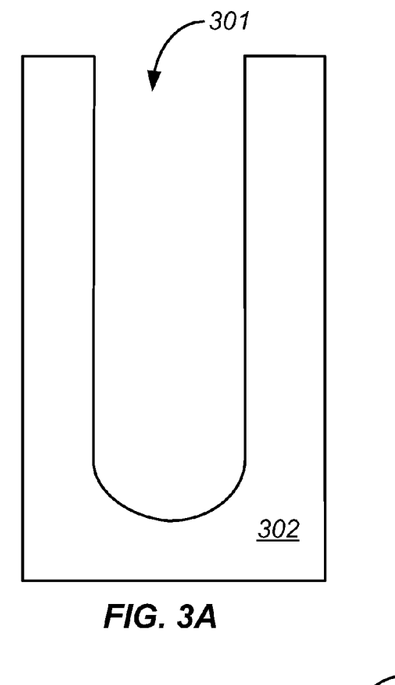
FIGS. 3A-3F show cross section views at various stages of a manufacturing process for forming the MOSFET in FIG. 2 in accordance with an embodiment of the invention.
Figure 3B:
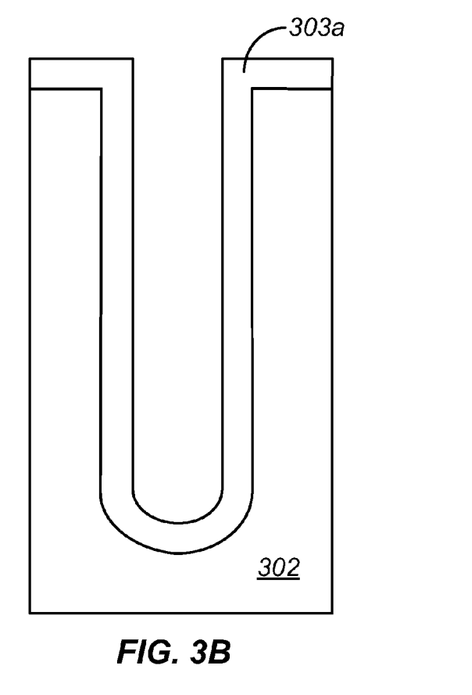

FIGS. 3A-3F show cross section views at various stages of a manufacturing process for forming the MOSFET in FIG. 2, in accordance with an embodiment of the invention. In FIG. 3A, a trench 301 is formed in an n-type epitaxial layer 302 using conventional techniques. Epitaxial layer extends over a substrate (not shown). In FIG. 3B, a layer of insulating material 303a is formed over the exposed silicon surfaces (including along the trench sidewalls and bottom) using for example a thermal oxidation process or by deposition of a dielectric liner. In one embodiment, the thickness of insulating layer 303a is approximately equal to the difference between the thickness of a conventional gate insulating layer (e.g., t1 in FIG. 2) and the desired thickness of the insulating layer at the bottom of the gate electrode (e.g., t2 in FIG. 2).

Figure 3C:
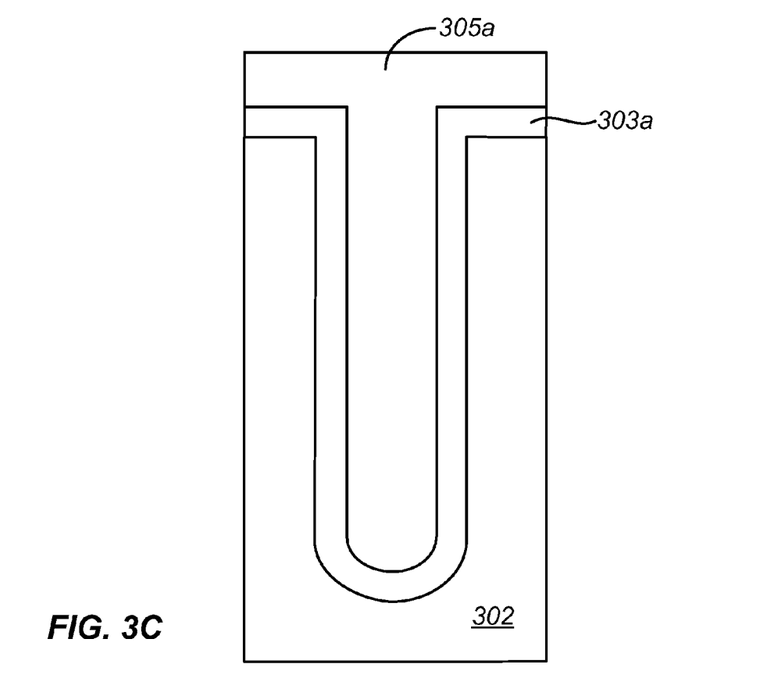

In FIG. 3C, the trench is filled with a material 305a that has a higher etch rate compared to insulating layer 303a. For example, fill material 305a may be any one of a number of different types of sacrificial films. Specific examples of fill material 305a would be deposited undensified silicon dioxide ($SiO_2$), borophosphosilicate glass (BPSG), phosphosilicate glass (PSG). The fill material needs to be uniform (i.e., have minimal voids and seams) to ensure uniform etching.

Figure 3D:
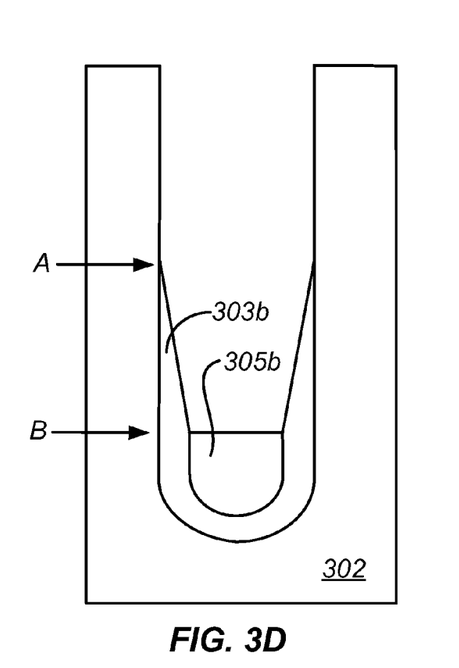

In FIG. 3D, both the fill material 305a and insulating layer 303a are isotropically etched (using wet or dry etch). With the fill material 305a etching faster than insulating layer 303a, the insulating layer 303a will gradually become exposed to the etchant from top-down as the fill material 305a is removed. After completion of the etch process, portion 303b of the insulating layer 303a remain along with bottom portion 305b of fill material 305a. The selection of the insulating layer 303a material, the fill material 305a, and the etch technique must be carefully considered to ensure that: (i) upon completion of the etch process, insulating layer 305a is completely removed from an upper portion of the trench sidewalls corresponding to the maximum doping concentration region in the channel region, and (ii) the slope along the exposed edge of insulting layer 303b, in view of the rate at which the doping concentration in the corresponding portion of the channel region drops, does not adversely affect the threshold voltage of the MOSFET. For example, if the fill material 305a has 6× etch rate of the insulating layer 303a, and the insulating layer 303a is about 500 Å thick, then the thickness of the resulting dielectric 303b will increase from 0 Å (at point A) to 500 Å (at point B) over a 3000 Å vertical distance.

Figure 4A:
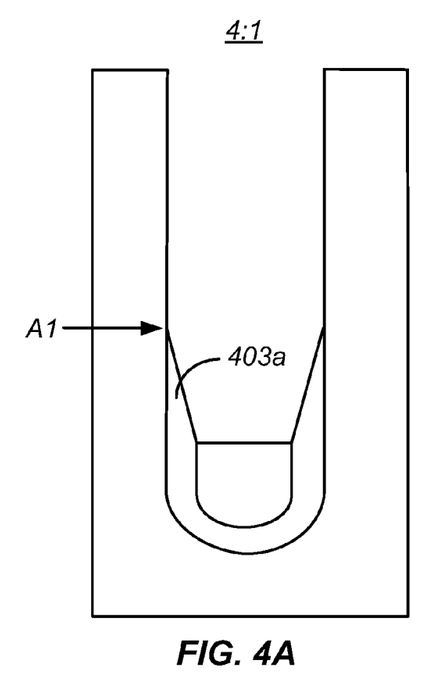
FIGS. 4A-4C shows the effect on the taper of the dielectric along the trench sidewalls with different ratios of etch rates.
Figure 4B:
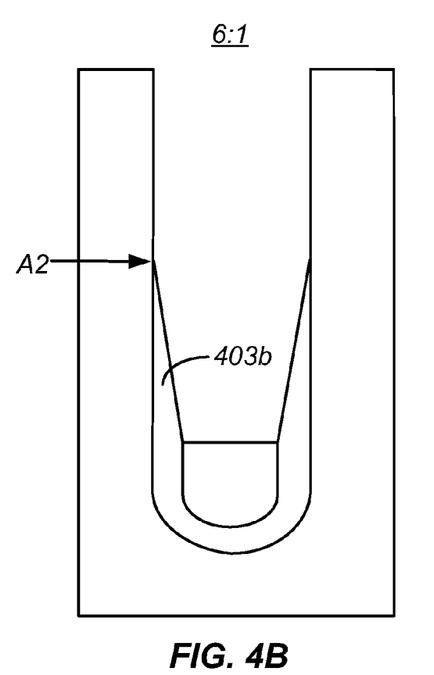
Figure 4C:
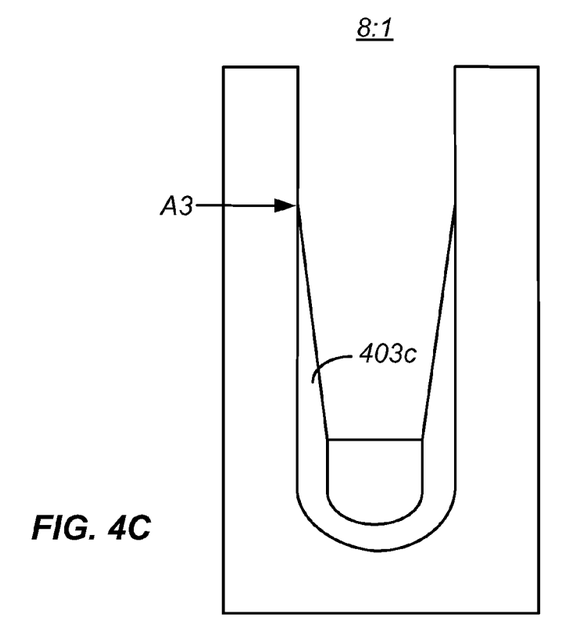

FIGS. 4A-4C show cross section views illustrating how the slope of the dielectric layer 403 may vary for three exemplary different etch rate ratios. FIG. 4A depicts the case where fill material 305a (FIG. 3c) has 4 times the etch rate of insulating layer 303a (FIG. 3C). FIG. 4B depicts the case where fill material 305a has 6 times the etch rate of insulating layer 303a, and FIG. 4C depicts the case where fill material 305a has 8 times the etch rate of insulating layer 303a. As can be seen, the higher the etch rate ratio, the shallower the slope of the dielectric layer 403 and the higher the point (i.e., points A1-A3) to which the dielectric layer 303a (FIG. 3C) is completely removed from along the trench sidewalls.

Figure 3E:
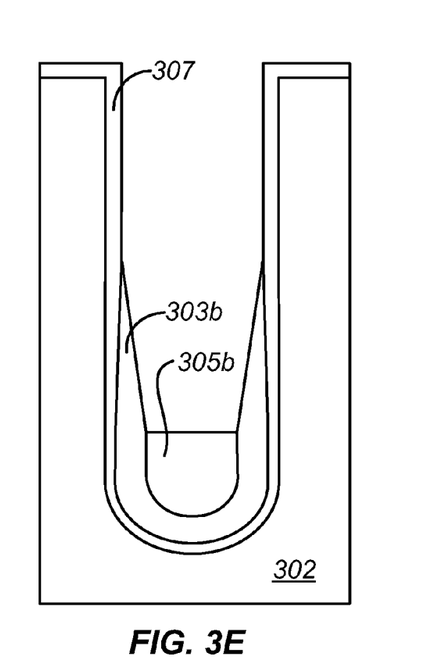

Referring to FIG. 3E, a conventional gate oxidation step is carried out to form gate oxide layer 307. The oxidation step results in growth of an insulating layer 307 having a uniform thickness along an upper portion of the trench sidewalls. Also, additional oxide growth takes place under insulating layer 303b. The thickness of the portion of insulating layer 307 underneath insulating layer 303b depends on the thickness of the existing dielectric material and the material properties of the dielectric and fill material. Generally the thicker the existing dielectric, the less oxide is grown.

Figure 3F:
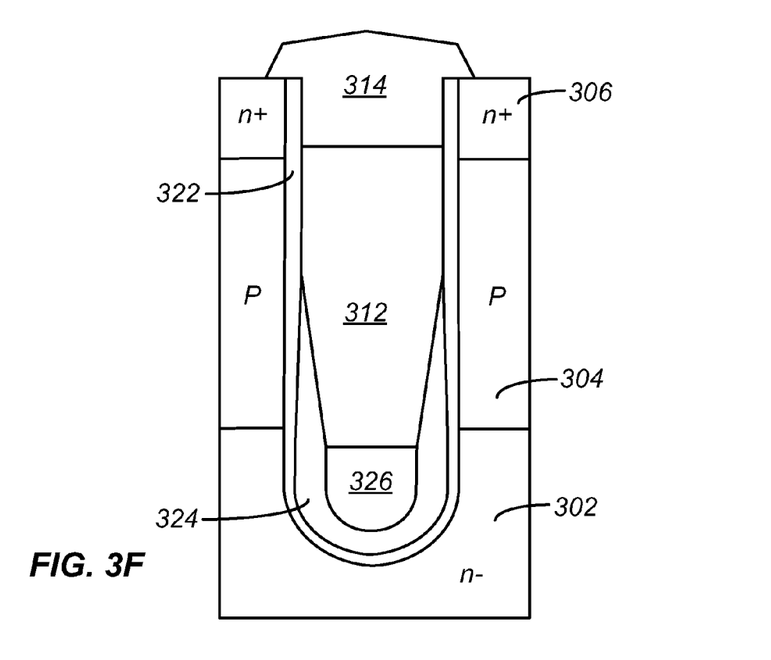

In FIG. 3F, well region 304 and source regions 306 are formed in epitaxial layer 302 using conventional ion implantation and annealing steps. Using known techniques, a recessed gate electrode 312 is formed in the trench, followed by an insulating material 314 capping the gate electrode 312. Well region 304 and source regions 306 may be formed at an earlier stage of the processing sequence than that shown in FIGS. 3A-3F. Source and drain metal layers (not shown) are respectively formed along the top-side and bottom-side of the structure. The source metal layer contacts source regions 306 and well region 304, and the drain metal layer contacts the substrate (not shown).

The above process sequence or portions thereof may be modified and integrated with other process sequences to obtain a lower Qgd. For example, the commonly assigned patent application titled "Structure and Method for Forming a Trench MOSFET having Self-Aligned Features," Ser. No. 10/442,670, filed on May 20, 2003, describes a process sequence for forming a trench gate MOSFET with self-aligned features, which application is incorporated herein by reference in its entirety. The process sequence depicted by FIGS. 2A-2K in the aforementioned application may be advantageously modified by incorporating the process module represented by FIG. 3A-3D of the present disclosure immediately after FIG. 2D of the aforementioned application.

The tapered gate dielectric technique of the present invention need not be combined with the thick-bottom-oxide (TBO) technique as illustrated in the figures of the present invention, although doing so yields a lower overall Qgd.

The cross-section views of the different embodiments may not be to scale, and as such are not intended to limit the possible variations in the layout design of the corresponding structures. Also, the various transistors can be formed in stripe or cellular architecture including hexagonal or square shaped transistor cells.

Although a number of specific embodiments are shown and described above, embodiments of the invention are not limited thereto. For example, it is understood that the doping polarities of the structures shown and described could be reversed to obtain p-channel FETs without departing from the invention. As another example, the trenches terminating in the epitaxial layer region 302 may alternatively terminate in the more heavily doped substrate (not shown in the figures). Therefore, the above description should not be taken as limiting the scope of the invention, which is defined by the appended claims.

What is claimed is:

1. A field effect transistor comprising:
   a trench extending into a semiconductor region;
   a gate dielectric lining the trench sidewalls;
   a gate electrode in the trench; and
   a channel region in the semiconductor region extending along a sidewall of the trench,
   wherein the gate dielectric has a non-uniform thickness, a variation in thickness of the gate dielectric along at least a lower portion of the channel region being inversely dependent on a variation in doping concentration in the lower portion of the channel region such that the variation in thickness of the gate dielectric does not increase a threshold voltage of the field effect transistor.

2. The field effect transistor of claim 1 wherein a lower portion of the gate dielectric has a tapered edge.

3. The field effect transistor of claim 1 wherein the semiconductor region has a first conductivity type, the field effect transistor further comprising:
   a well region of a second conductivity type in the semiconductor region; and
   a source region of the first conductivity type in the well region;
   wherein the channel region extends in the well region and is defined by a spacing between the source region and a bottom surface of the well region.

4. The field effect transistor of claim 3 wherein the doping concentration in the channel region decreases from a maximum concentration in the direction from the source region toward a bottom surface of the well region, and a thickness of the gate dielectric increases from a point below the maximum concentration in the direction from the source region to the bottom surface of the well region.

5. The field effect transistor of claim 3 wherein the semiconductor region includes an epitaxial layer of the first conductivity type extending over a substrate of the first conductivity type, the well region being formed in the epitaxial layer, and the trench extending through the well region and terminating below the bottom surface of the well region.

6. A field effect transistor comprising:
a trench extending into a semiconductor region of a first conductivity type;
a gate dielectric lining the trench sidewalls;
a gate electrode in the trench;
a well region of the second conductivity type in the semiconductor region;
a source region of the first conductivity type in the well region; and
a channel region extending along a trench sidewall in the well region, the channel region being defined by a spacing between the source region and a bottom surface of the well region, the channel region having a doping concentration which decreases from a maximum concentration in the direction from the source region toward a bottom surface of the well region, and the gate dielectric having a uniform thickness along an upper portion of the channel region and a non-uniform thickness along a remaining lower portion of the channel region, the non-uniform thickness of the gate dielectric increasing from a point below the maximum concentration in the direction from the source region to a point below the bottom surface of the well region,
wherein a rate at which the non-uniform thickness of the gate dielectric increases is dependent on a rate at which the doping concentration in the corresponding portion of the channel region decreases such that the increase in the gate dielectric thickness does not increase a threshold voltage of the FET.

7. The field effect transistor of claim 6 wherein the gate electrode has an upper portion with a substantially uniform width and a lower portion with inwardly tapered sidewalls.

8. The field effect transistor of claim 6 further comprising a thick bottom insulator below the gate electrode, a thickness of the gate dielectric at an interface between the gate electrode and the thick bottom insulator being greater than a thickness of the gate dielectric at any point above the interface.

9. A field effect transistor comprising:
a semiconductor region of a first conductivity type;
a well region of a second conductivity type in the semiconductor region;
a source region of the first conductivity type in the well region;
a trench extending into the semiconductor region;
a gate dielectric lining the trench sidewalls;
a gate electrode in the trench;
a channel region extending along a trench sidewall in the well region, the channel region having a channel length defined by a spacing between the source region and a bottom surface of the well region,
wherein the gate dielectric has an upper portion with a uniform thickness and a lower portion with a non-uniform thickness, the lower portion of the gate dielectric extending along at least one-half the channel length, wherein a thickness of the gate dielectric at any point along the lower portion of the gate dielectric is greater than the uniform thickness of the gate dielectric, and
wherein a thickness of the gate dielectric linearly increases from a point along an upper half of the channel region to a second thickness at a point below the bottom surface of the well region.

10. The field effect transistor of claim 9 wherein the lower portion of the gate dielectric has a tapered edge.

11. The field effect transistor of claim 9 wherein the trench includes a thick bottom insulator below the gate electrode, the thick bottom insulator having a greater thickness than the uniform thickness of the upper portion of the gate dielectric.

12. The field effect transistor of claim 9 wherein the semiconductor region includes an epitaxial layer of the first conductivity type extending over a substrate of the first conductivity type, the well region being formed in the epitaxial layer, and the trench extending through the well region and terminating below a bottom surface of the well region.

13. A field effect transistor comprising:
a semiconductor region;
a trench extending into the semiconductor region;
a gate dielectric lining the trench sidewalls;
a gate electrode in the trench; and
a channel region extending along a sidewall of the trench,
wherein the gate dielectric has an upper portion with a uniform thickness, and a thickness of the gate dielectric linearly increases from a first thickness at a point along an upper half of the channel region to a second thickness at a point near a bottom surface of the gate electrode.

14. The field effect transistor of claim 13 wherein the semiconductor region has a first conductivity type, the field effect transistor further comprising:
a well region of a second conductivity type in the semiconductor region;
a source region of the first conductivity type in the well region;
a thick bottom insulator in the trench below the gate electrode, the thick bottom insulator having a greater thickness than the first thickness of the gate dielectric;
wherein the trench extends through the well region and terminates below a bottom surface of the well region, and the channel region extends in the well region and is defined by a spacing between the source region and the bottom surface of the well region.

15. A field effect transistor comprising:
a semiconductor region of a first conductivity type;
a well region of a second conductivity type in the semiconductor region;
a source region of the first conductivity type in the well region;
a trench extending into the semiconductor region;
a gate dielectric lining the trench sidewalls;
a gate electrode in the trench;
a channel region extending along a trench sidewall in the well region, the channel region having a channel length defined by a spacing between the source region and a bottom surface of the well region,
wherein the gate dielectric has an upper portion with a uniform thickness and a lower portion with a non-uniform thickness, the lower portion of the gate dielectric extending along at least one-half the channel length, wherein a thickness of the gate dielectric at any point along the lower portion of the gate dielectric is greater than the uniform thickness of the gate dielectric, and wherein the channel region has a doping concentration which decreases from a maximum value near the source region to a lower value near a bottom surface of the well region, and wherein a variation in thickness of the lower portion of the gate dielectric is inversely dependent on the variation in the doping concentration in the channel region.

16. The field effect transistor of claim 15 wherein the lower portion of the gate dielectric has a tapered edge.

17. The field effect transistor of claim 15 wherein the trench includes a thick bottom insulator below the gate electrode, the thick bottom insulator having a greater thickness than the uniform thickness of the upper portion of the gate dielectric.

18. The field effect transistor of claim 15 wherein the semiconductor region includes an epitaxial layer of the first conductivity type extending over a substrate of the first conductivity type, the well region being formed in the epitaxial layer, and the trench extending through the well region and terminating below a bottom surface of the well region.

19. A field effect transistor comprising:
a trench extending into a semiconductor region;
a gate dielectric lining the trench sidewalls;
a gate electrode in the trench; and
a channel region in the semiconductor region extending along a sidewall of the trench,
wherein at least a portion of the gate dielectric has a non-uniform thickness which linearly increases along at least a lower portion of the channel region starting from a point along an upper half of the channel region, the linear increase in thickness of the gate dielectric along the at least a lower portion of the channel region being inversely dependent on a variation in doping concentration in the at least a lower portion of the channel region.

20. The field effect transistor of claim 18 wherein a lower portion of the gate dielectric has a tapered edge.

21. The field effect transistor of claim 18 wherein the semiconductor region has a first conductivity type, the field effect transistor further comprising:
a well region of a second conductivity type in the semiconductor region; and
a source region of the first conductivity type in the well region;
wherein the channel region extends in the well region and is defined by a spacing between the source region and a bottom surface of the well region.

22. The field effect transistor of claim 21 wherein the doping concentration in the channel region decreases from a maximum concentration in the direction from the source region toward a bottom surface of the well region, and a thickness of the gate dielectric increases from a point below the maximum concentration in the direction from the source region to the bottom surface of the well region.

23. The field effect transistor of claim 21 wherein the semiconductor region includes an epitaxial layer of the first conductivity type extending over a substrate of the first conductivity type, the well region being formed in the epitaxial layer, and the trench extending through the well region and terminating below the bottom surface of the well region.

* * * * *